US012811268B2

(12) United States Patent

Singh et al.

(10) Patent No.: US 12,811,268 B2

(45) Date of Patent: Nov. 24, 2026

(54) SENSE-TAP DEVICE FOR QUBIT COHERENCE VERIFICATION AND ERROR DETECTION IN QUANTUM MEMORIES

(71) Applicant: Dell Products L.P., Round Rock, TX (US)

(72) Inventors: Tejinder Singh, Manotick (CA); Navjot Kaur Khaira, Manotick (CA)

(73) Assignee: DELL PRODUCTS L.P., Round Rock, TX (US)

( * ) Notice: Subject to any disclaimer, the term of this patent is extended or adjusted under 35 U.S.C. 154(b) by 19 days.

(21) Appl. No.: 18/961,091

(22) Filed: Nov. 26, 2024

(65) Prior Publication Data

US 2026/0163223 A1 Jun. 11, 2026

(51) Int. Cl.

*H01P 7/08* (2006.01)
*G01R 33/32* (2006.01)
*H10N 60/12* (2023.01)

(52) U.S. Cl.

CPC ............ *H01P 7/088* (2013.01); *G01R 33/326* (2013.01); *H01P 7/082* (2013.01); *H10N 60/12* (2023.02)

(58) Field of Classification Search

CPC ....... H01P 7/088; H01P 7/082; G01R 33/326; H10N 60/12

See application file for complete search history.

(56) References Cited

U.S. PATENT DOCUMENTS

2021/0328127 A1* 10/2021 Kwon .................... G06N 10/40
2025/0200412 A1* 6/2025 Sandberg ............... G06N 10/40

OTHER PUBLICATIONS

Asfaw, A. Sigillito, A. Tyryshkin, T. Schenkel, and S. A. Lyon, "Multi-frequency spin manipulation using rapidly tunable superconducting coplanar waveguide microresonators," Appl. Phys. Lett., vol. 111, No. 3, 2017. 6 pages.

J. Healey, T. Lindström, M. Colclough, C. Muirhead, and A. Y. Tzalenchuk, "Magnetic field tuning of coplanar waveguide resonators," Appl. Phys. Lett., vol. 93, No. 4, 2008. 15 pages.

(Continued)

*Primary Examiner* — Xiaochun L Chen

(74) *Attorney, Agent, or Firm* — Amin, Turocy & Watson, LLP

(57) ABSTRACT

The technology described herein is directed towards a quantum memory cell for writing, storing and reading a quantum bit (qubit) of information, based on variable coupling between a tunable interface resonator and quantum storage cavity. Tuning the resonators to the same frequency facilitates the energy exchange of qubit information, thereby transferring quantum information to or from the quantum storage cavity for a write operation or a read operation, respectively; detuning stores the quantum information in the quantum storage cavity by preventing transfer. One implementation uses rf-SQUIDs for tuning the tunable interface resonator, based on a control current, to the fixed resonance frequency of the quantum storage cavity. This facilitates fast frequency adjustments to tune and detune the tunable resonator, enabling management of the quantum state read/write operations. Also described is an integrated qubit monitoring system utilizing sense taps connected to the quantum storage cavity via the rf-SQUIDs.

20 Claims, 12 Drawing Sheets

(56) References Cited

OTHER PUBLICATIONS

J. Annunziata, D. F. Santavicca, L. Frunzio, G. Catelani, M. J. Rooks, A. Frydman, and D. E. Prober, "Tunable superconducting nanoinductors," Nanotechn, vol. 21, No. 44, 2010. 6 pages.
M. R. Vissers, J. Hubmayr, M. Sandberg, S. Chaudhuri, C. Bockstiegel, and J. Gao, "Frequency-tunable superconducting resonators via nonlinear kinetic inductance," Appl. Phys. Lett., vol. 107, No. 6, 2015. 10 pages.
O. Kennedy, J. Burnett, J. Fenton, N. Constantino, P.Warburton, J. Morton, and E. Dupont-Ferrier, "Tunable Nb superconducting resonator based on a constriction nano-SQUID fabricated with a Ne focused ion beam," Physical Rev. Appl., vol. 11, No. 1, 2019. 9 pages.
Khaira, et al. "Superconducting Tunable Resonator With Wide Tuning Range Utilizing Radio Frequency Superconducting Quantum Interference Devices and Multi-Stacked Capacitor" U.S. Appl. No. 18/961,071, filed Nov. 26, 2024, 34 pages.
Singh, et al. "Multi-Bit Quantum Memory Cell With Integrated High Quality Factor Storage Resonators" U.S. Appl. No. 18/961,111, filed Nov. 26, 2024, 49 pages.
Singh, et al. "Quantum Memory Cell Using Broadband Superconducting Tunable Resonator" U.S. Appl. No. 18/961,119, filed Nov. 26, 2024, 40 pages.
Singh, et al. "Monolithic Integrated Quantum Memory Device Array With Multi-Layer Superconducting Stack" U.S. Appl. No. 18/961,141, filed Nov. 26, 2024, 45 pages.
Notice of Allowance received for U.S. Appl. No. 18/961,111 dated Jul. 10, 2026, 10 pages.
Notice of Allowance received for U.S. Appl. No. 18/961,141 dated May 7, 2026, 11 pages.

* cited by examiner

SENSE-TAP DEVICE FOR QUBIT COHERENCE VERIFICATION AND ERROR DETECTION IN QUANTUM MEMORIES

RELATED APPLICATIONS

The subject patent application is related to U.S. patent application Ser. No. 18/961,071, filed Nov. 26, 2024, and entitled "SUPERCONDUCTING TUNABLE RESONATOR WITH WIDE TUNING RANGE UTILIZING RADIO FREQUENCY SUPERCONDUCTING QUANTUM INTERFERENCE DEVICES AND MULTI-STACKED CAPACITOR", U.S. patent application Ser. No. 18/961,119, filed Nov. 26, 2024, and entitled "QUANTUM MEMORY CELL USING BROADBAND SUPERCONDUCTING TUNABLE RESONATOR", U.S. patent application Ser. No. 18/961,141, filed Nov. 26, 2024, and entitled "MONOLITHIC INTEGRATED QUANTUM MEMORY DEVICE ARRAY WITH MULTI-LAYER SUPERCONDUCTING STACK", U.S. patent application Ser. No. 18/961,111, filed Nov. 26, 2024, and entitled "MULTI-BIT QUANTUM MEMORY CELL WITH INTEGRATED HIGH QUALITY FACTOR STORAGE RESONATORS", the respective entireties of which patent applications are hereby incorporated by reference herein.

BACKGROUND

In the field of quantum computing, quantum memory devices store quantum information, including the state of quantum bits (qubits), while preserving the coherence of the quantum states. As such, efficient and reliable quantum memory devices are needed in quantum technologies.

BRIEF DESCRIPTION OF THE DRAWINGS

The technology described herein is illustrated by way of example and not limited to the accompanying figures in which like reference numerals indicate similar elements and in which.

DETAILED DESCRIPTION

Figure 1:
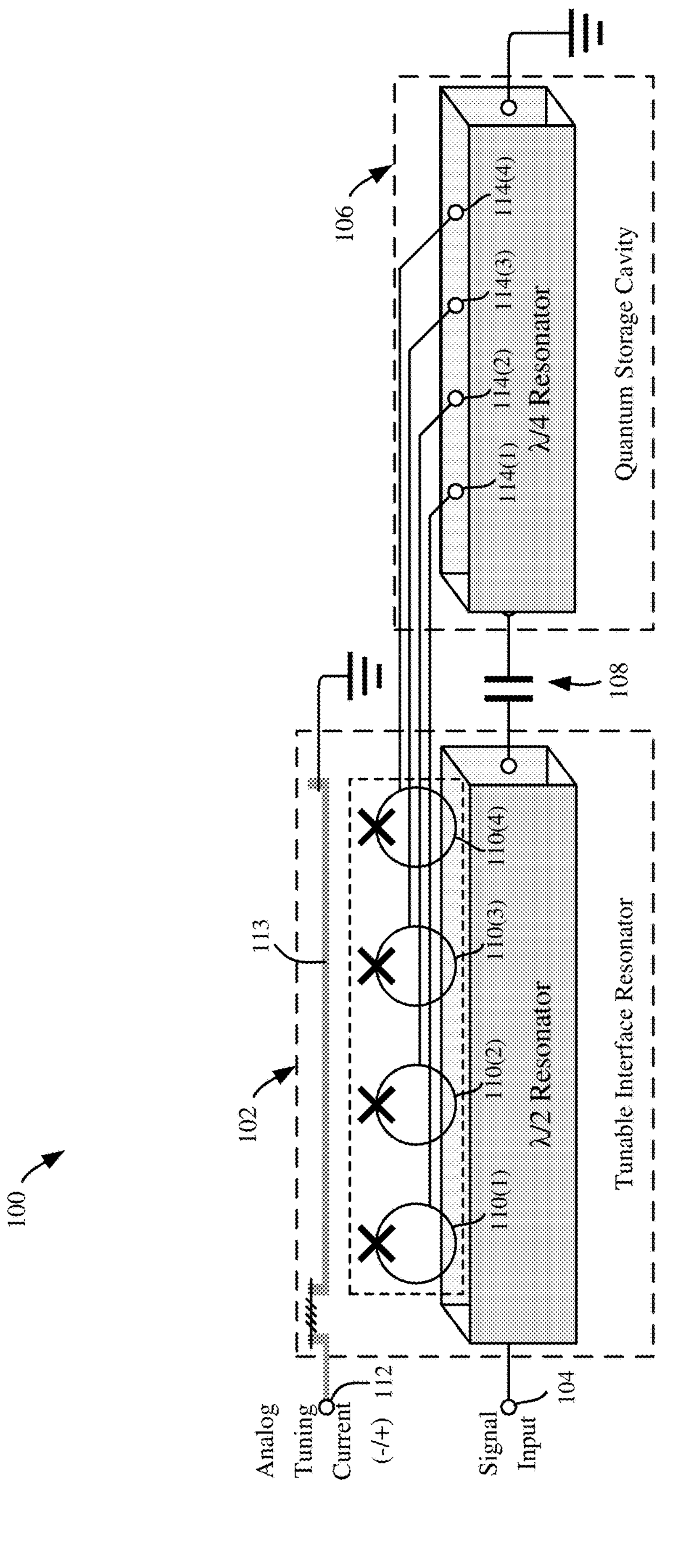
FIG. 1 is a schematic representation of an example quantum memory cell using a tunable interface resonator and a quantum storage cavity, in which the tuning of the resonator is achieved by using radio frequency-superconducting quantum interference devices (rf-SQUIDs), in accordance with various example embodiments and implementations of the subject disclosure.

The technology described herein is generally directed towards a quantum memory cell, capable of storing a quantum bit (qubit) of information, based on variable coupling between a tunable interface resonator and quantum storage cavity (e.g., with a fixed resonator) for enhanced information security. By adjusting the tuning and detuning between the resonators, the system control the energy exchange of qubit information, thereby allowing or preventing the transfer of quantum information to and from the quantum storage cavity, respectively. The variable coupling provides a significant security advantage, as detuning can completely decouple the storage cavity, effectively isolating the stored quantum information.

One design of the quantum memory cell incorporates a current-controlled resonance tuning of the tunable (interface) resonator using rf-SQUIDs. In one example implementation, a group of (e.g., four) rf-SQUID are placed along with an inductor in the resonator. When a small current is applied on a control line proximate to the rf-SQUIDs, the rf-SQUIDs' inductance, and consequently the resonator's total inductance, varies, whereby tuning the inductance is equivalent to tuning the resonant frequency for the resonator. The on-chip current in the control line running close to the rf-SQUIDs provides a changing magnetic field to the rf-SQUIDs. In this way, a wideband tuning mechanism in a superconducting resonator is achieved using a relatively small, practical number of (e.g. four) rf-SQUIDs. This facilitates extremely fast resonance frequency adjustments. The use of rf-SQUIDs provides fine control over the coupling between the tunable interface resonator and the quantum storage cavity, enabling precise management of the quantum state transfer and read/write operations.

In one implementation, one example design includes an integrated error detection system utilizing a sense tap device (a group of sense taps) connected to the quantum storage cavity via the rf-SQUIDs. This facilitates real-time monitoring of the coherence of the stored quantum bit, e.g., via a classical (non-quantum) computer. The presence of these sense taps ensures that any deviations in the expected quantum state can be detected promptly, maintaining the integrity and authenticity of the stored information.

Reference throughout this specification to “one embodiment,” “an embodiment,” “one implementation,” “an implementation,” etc. means that a particular feature, structure, characteristic and/or attribute described in connection with the embodiment/implementation can be included in at least one embodiment/implementation. Thus, the appearances of such a phrase “in one embodiment,” “in an implementation,” etc. in various places throughout this specification are not necessarily all referring to the same embodiment/implementation. Furthermore, the particular features, structures, characteristics and/or attributes may be combined in any suitable manner in one or more embodiments/implementations. Repetitive description of like elements employed in respective embodiments may be omitted for sake of brevity.

The detailed description is merely illustrative and is not intended to limit embodiments and/or application or uses of embodiments. Furthermore, there is no intention to be bound by any expressed or implied information presented in the preceding sections, or in the Detailed Description section. Further, it is to be understood that the present disclosure will be described in terms of a given illustrative architecture; however, other architectures, structures, materials and process features, and steps can be varied within the scope of the present disclosure.

It also should be noted that terms used herein, such as “optimize,” “optimization,” “optimal,” “optimally” and the like only represent objectives to move towards a more optimal state, rather than necessarily obtaining ideal results. Similarly, “maximize” means moving towards a maximal state (e.g., up to some processing capacity limit), not necessarily achieving such a state, and so on.

It will also be understood that when an element such as a layer, region or substrate is referred to as being “on” or “over” “atop” “above” “beneath” “below” and so forth with respect to another element, it can be directly on the other element or intervening elements can also be present. In contrast, only if and when an element is referred to as being “directly on” or “directly over” another element, are there no intervening element(s) present. Note that orientation is generally relative; e.g., “on” or “over” can be flipped, and if so, can be considered unchanged, even if technically appearing to be under or below/beneath when represented in a flipped orientation. It will also be understood that when an element is referred to as being “connected” or “coupled” to another element, it can be directly connected or coupled to the other element or intervening elements can be present. In contrast, only if and when an element is referred to as being “directly connected” or “directly coupled” to another element, are there no intervening element(s) present.

The following detailed description is merely illustrative and is not intended to limit embodiments and/or application or uses of embodiments. Furthermore, there is no intention to be bound by any expressed or implied information presented in the preceding sections, or in the Detailed Description section.

One or more example embodiments are now described with reference to the drawings, in which example components, graphs and/or operations are shown, and in which like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details, and that the subject disclosure may be embodied in many different forms and should not be construed as limited to the examples set forth herein.

FIG. 1 shows one example design of a quantum memory cell 100, in which a λ/2 tunable superconducting resonator 102, (also referred to herein as a “tunable interface resonator” or simply tunable resonator”), facilitates coupling between a transmission feed-line (signal input 104) and a λ/4 fixed frequency resonator, referred to herein as a “quantum storage cavity” 106. In general, quantum memory cells using microwave resonators requires careful consideration of storage time, read/write operations, and integration capability, whereby in one implementation, the quantum storage cavity 106 is designed with a relatively high-quality factor (high-Q) for long-term information storage, while the tunable interface resonator 104 is designed with a relatively low-quality factor (low-Q), which facilitates fast read/write operations.

The example tunable interface resonator 102 of FIG. 1 is connected to the quantum storage cavity” 106 via a coupling capacitor 108. As described herein with reference to FIG. 3, the resonance frequency of the tunable interface resonator 102 is primarily defined by an inductive component and a capacitive component. The tunable interface resonator’s resonance frequency can be tuned using a suitable number of (e.g., four in FIG. 1) radio frequency superconducting quantum interference devices (rf-SQUIDs) 110(1)-110(4), which alter the resonator’s inductance; such rf-SQUIDs allow the tuning of the resonator extremely rapidly, via an analog (e.g., DC) tuning current input via contact pad 112/control line 113. This tunable resonator acts as an intermediary, like a gate, controlling the transfer of quantum information between the transmission line and the high-Q quantum storage cavity 106.

In one implementation, the other resonator (of the quantum storage cavity 106) contains no SQUID and thus has a fixed resonance frequency and a long quantum information storage lifetime. The lifetime of the stored quantum information depends on the quantum storage cavity’s Q-factor, as it determines the coherence time of the microwave photon. The coupling strength between the tunable interface resonator 102 and quantum storage cavity 104 is adjustable via the rf-SQUIDs 110(1)-110(4), allowing for precise control over the energy exchange. When the resonators are resonating at the same frequency, the energy is transferred from one to another while when they are out-of-tune, the energy is not transferred.

The technology described herein thus ensures that the quantum storage cavity 106 can be fully isolated when not interacting with the tunable interface resonator 102, protecting the stored quantum information. Hence, the device’s read/write operations are regulated by controlling the current provided to the control line 112 passing close to the rf-SQUIDs 110(1)-110(4), allowing for information transfer or the isolation. This control line 112 provides external isolated control of the magnetic flux coupled with the rf-SQUIDs 110(1)-110(4). This setup provides a secure and efficient method for storing and retrieving quantum information.

In one implementation, a sense tap device provides for error detection and checking of the coherence of the stored qubit in the quantum storage cavity 106. To this end, the rf-SQUIDs 110(1)-110(4) are also connected via respective sense taps 114(1)-114(4) to the quantum storage cavity 106 for error detection and checking the coherence of the stored bit, ensuring the authenticity of the stored bit. For example, via the sense taps, which are very close to the fixed resonator, a computing device can determine if the coherence times are correct, e.g., what is the qubit state at w percent, x percent, y percent and z percent of the resonator cavity; e.g., if the stored qubit starts to die down to soon, the signal readouts from the sense taps 114(1)-114(4) indicate such a situation.

Figure 2:
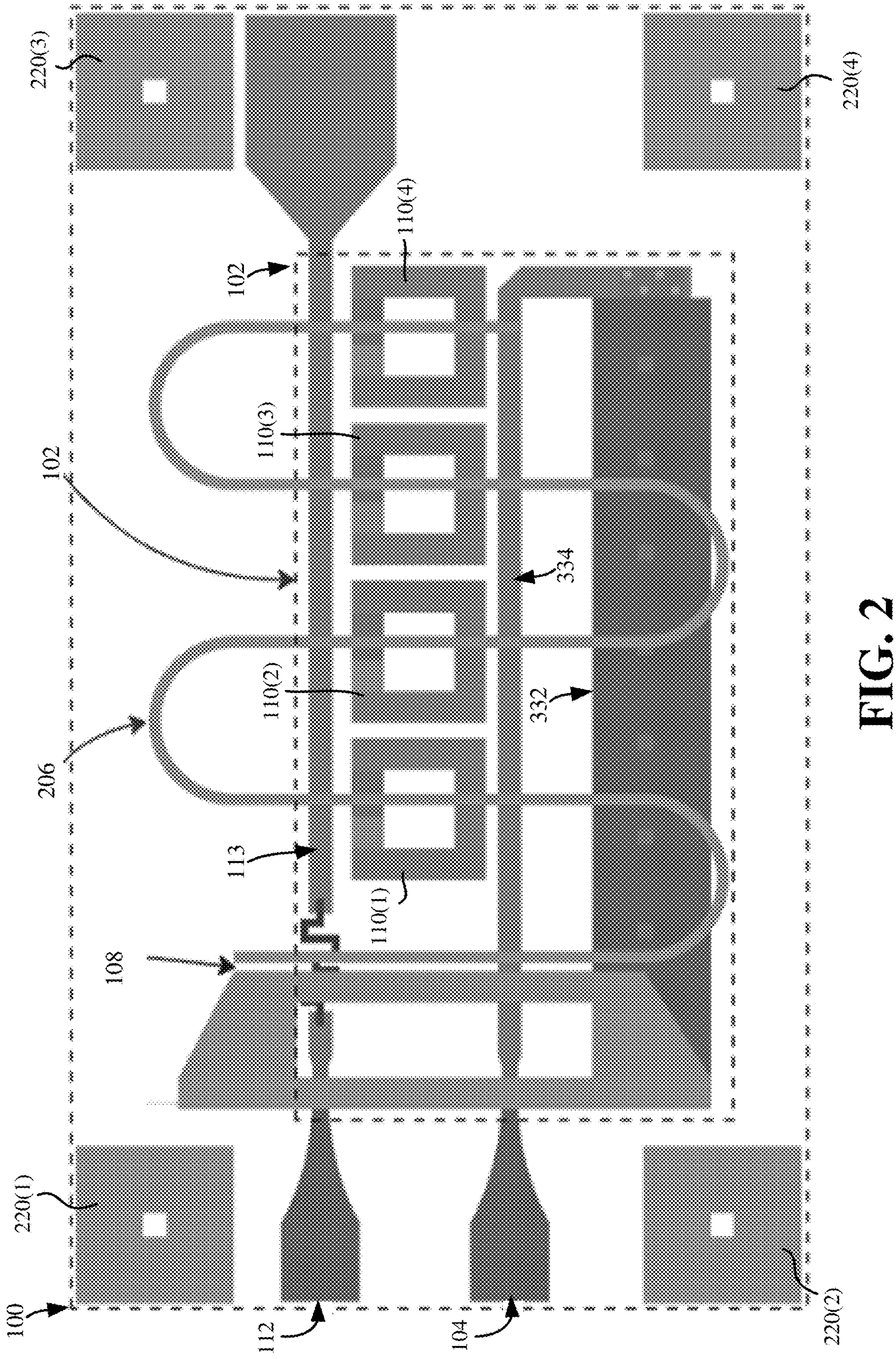
FIG. 2 is a bottom view representation, highlighting example components of an example quantum memory cell including multiple thin film layers, in accordance with various example embodiments and implementations of the subject disclosure.

FIG. 2 shows a planar multi-layer design for the quantum memory cell 100 from the bottom (with layers such as the thin film layer 2 and substrate omitted to facilitate viewing of the components). The fixed resonator corresponding to the quantum storage cavity 106 is shown as a meandering, serpentine microstrip line 206, coupled via the coupling capacitor 108 to the tunable resonator 102. In one implementation, the transmission feedline coupled to the signal input 104, and rest of the circuit, is designed with characteristic impedance (Z0) of 50Ω. Four E-H shielding poles 220(1)-220(4), one per corner, help isolate any excess magnetic flux from nearby components, e.g., additional resonators/quantum memory cells.

Figure 3:
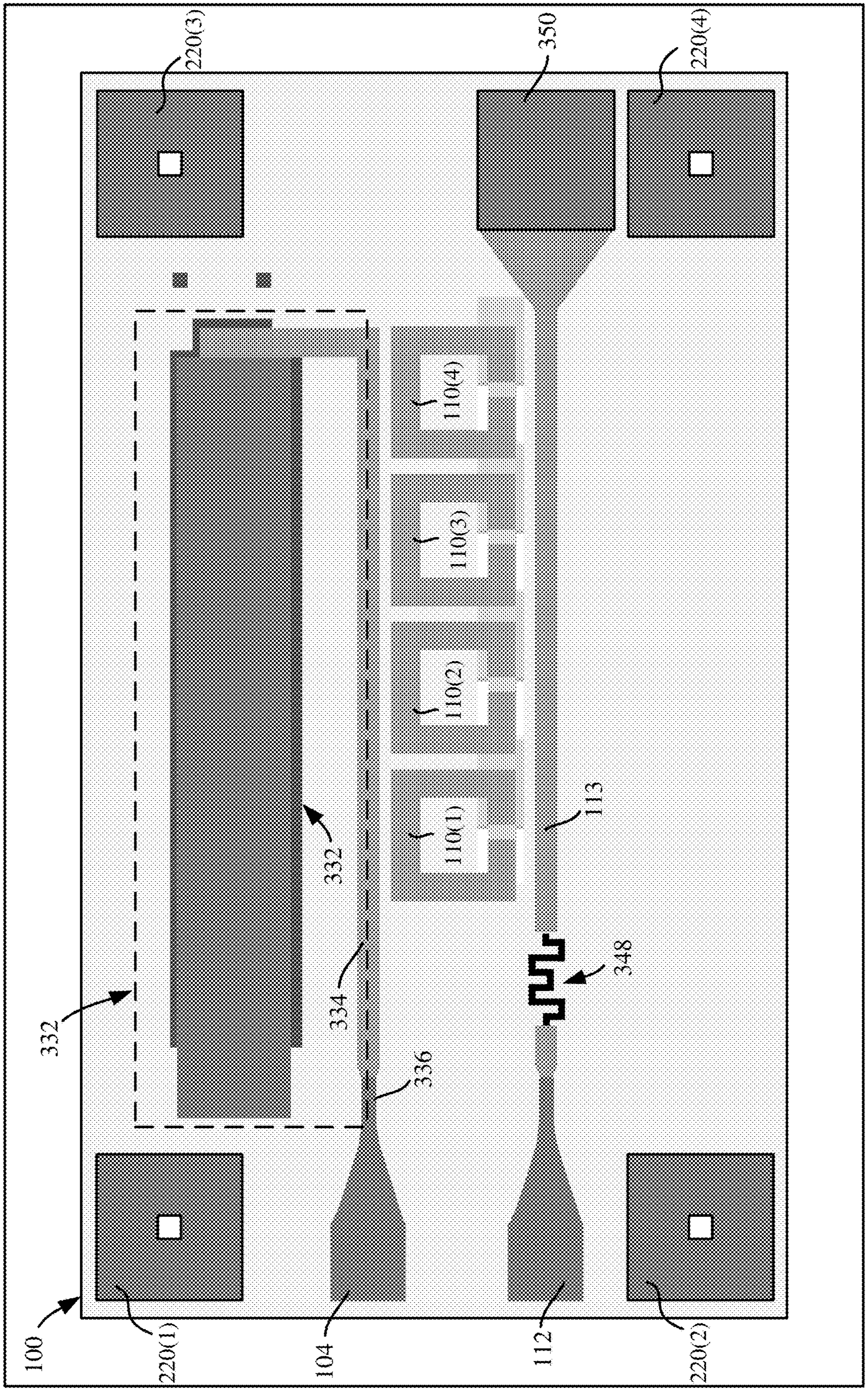
FIG. 3 is a top view representation, highlighting example components of the tunable interface resonator of the example quantum memory cell, in accordance with various example embodiments and implementations of the subject disclosure.
Figure 8:
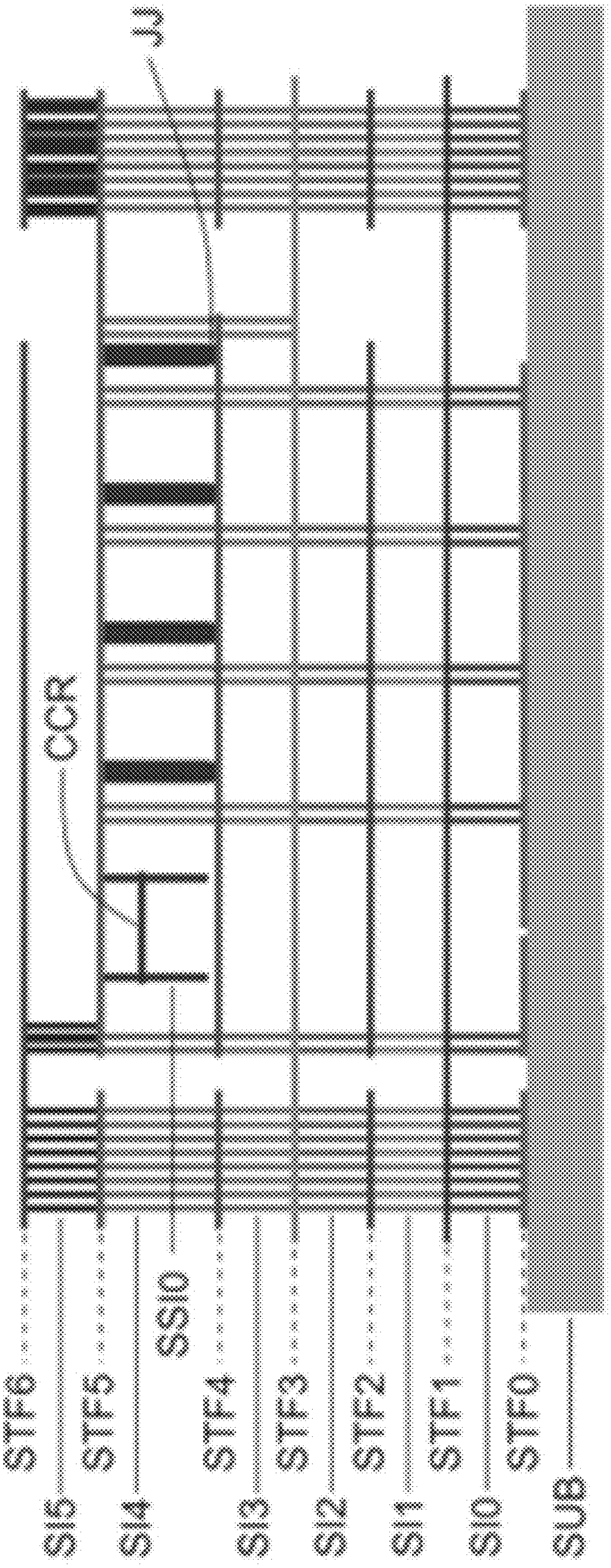
FIG. 8 is a sideview representation showing a multilayer stack including superconducting thin film layers used in example superconducting device designs, in accordance with various example embodiments and implementations of the subject disclosure.

As shown in FIGS. 2 and 3 (top view), the signal input 104 is provided to the tunable interface resonator 102 that includes a multi-plate stacked capacitor 332 and a microstrip inductor 334. In one implementation, the multi-plate capacitor 332 is spread across five superconducting thin-film layers (STF0-STF6), as shown in FIG. 8. In this example, the four rf-SQUIDs 110(1)-110(4) are placed parallel along the microstrip inductor 334, and a control current line 336 (input via contact 112) runs parallel to the rf-SQUIDs 110(1)-110 (4).

More particularly, FIG. 3 shows a top view highlighting the layout and a chip design of the example superconducting resonator portion of the quantum memory cell 100 as described herein. The signal input port 104 is connected by a superconducting microstrip transmission line 336 to the superconducting inductor 334. The multi-stacked metal-insulator-metal (MIM) capacitor 332 having capacitance (C) and the superconducting inductor 334 with inductance (L) are connected in series with the transmission line section 336 connected with the signal input port 334.

In one implementation, the superconducting inductor 340 and the MIM capacitor 342 are sized to tune the resonance frequency within the frequency band 4 GHz to 8 GHz, which is one of the most popular for the quantum systems. The tunable inductor 340 is implemented using a transmission line loaded with an array of (e.g., four) rf-SQUIDs 110(1)-110(4), and is terminated in a short circuit.

An isolated control wire 113 for an analog tuning level current (I+) carrying a DC-current is placed adjacent to the array of rf-SQUIDs 110(1)-110(4) to tune their inductance as described herein. The current is input at port 112 and controlled through a current controlling element 348, terminating at ground (block 350).

Figure 4:
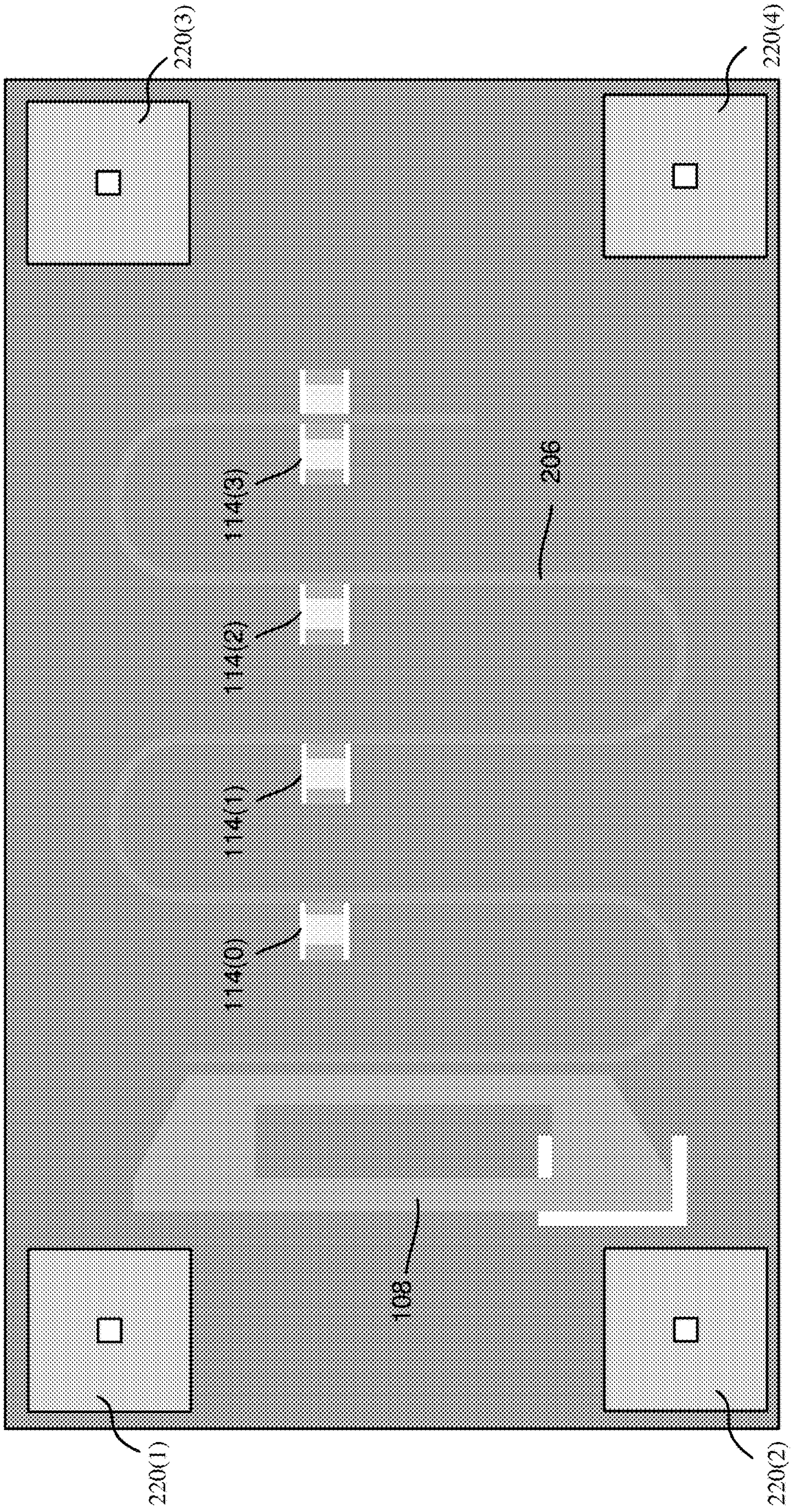
FIG. 4 is a bottom view representation, highlighting a meandering (serpentine) fixed resonator of the lowest layer (above the substate) of the example quantum memory cell, in accordance with various example embodiments and implementations of the subject disclosure.

This tunable interface resonator is thus coupled capacitively to the quantum storage cavity 104, which is a fixed length microstrip resonator 206 (e.g., on superconducting thin film 0) shown more clearly in the bottom view (substrate omitted) of the cell in FIG. 4. The sense taps 10(1)-110(4) for monitoring/managing stored bit coherence are also shown.

Figure 5:
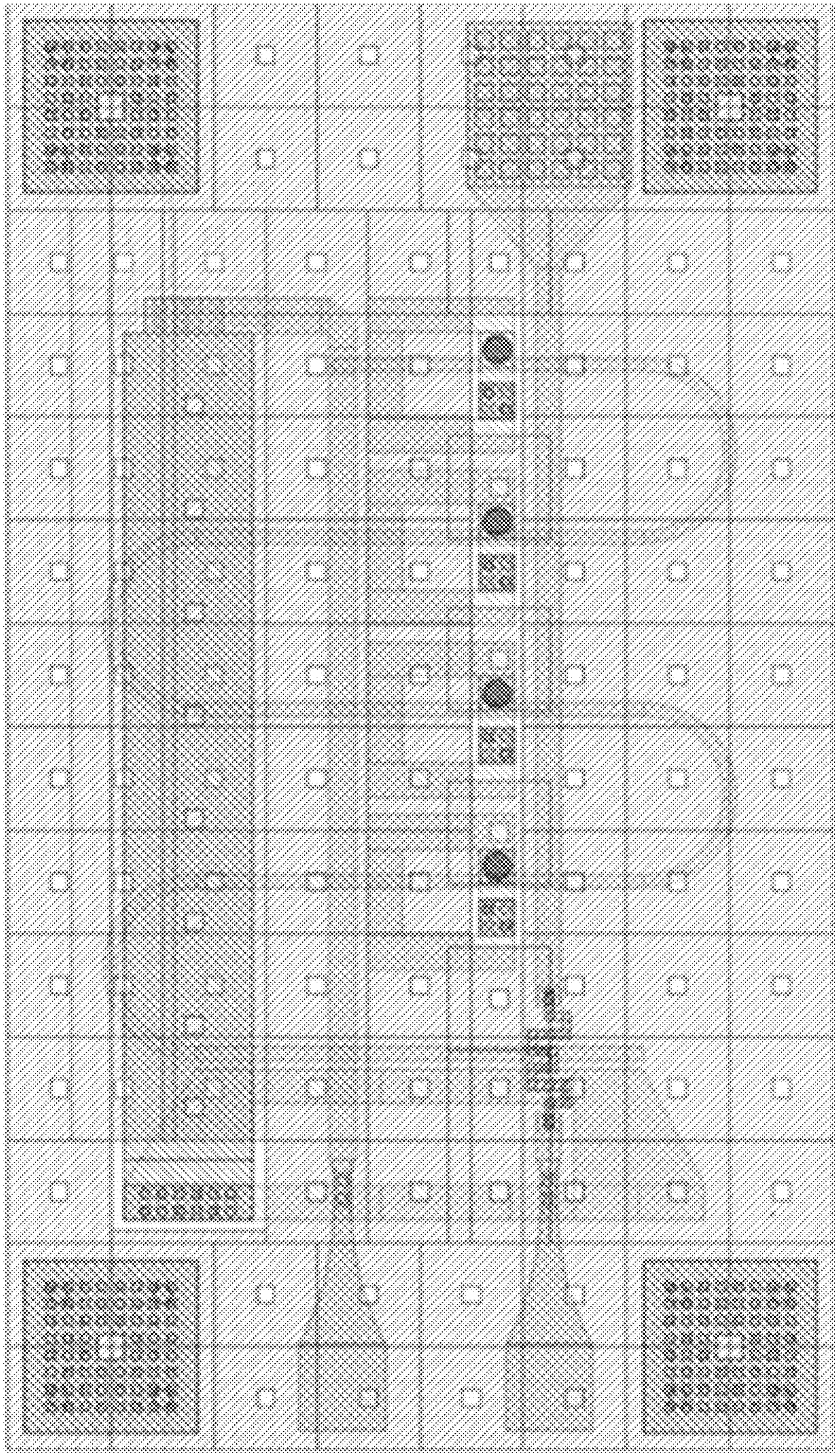
FIG. 5 is a top-to-bottom, two-dimensional layered view representation of one example design layout for the quantum memory cell, in accordance with various example embodiments and implementations of the subject disclosure.

The complete layout of the example memory cell is shown in FIG. 5 (2D view without component labels to highlight how the components of FIGS. 1-4 overlay other components), the small gray squares in FIG. 5 represent the interconnects between layers, while the white squares represent perforations, particularly in STF2 and STF4, (used for fabrication purposes).

Figure 6:
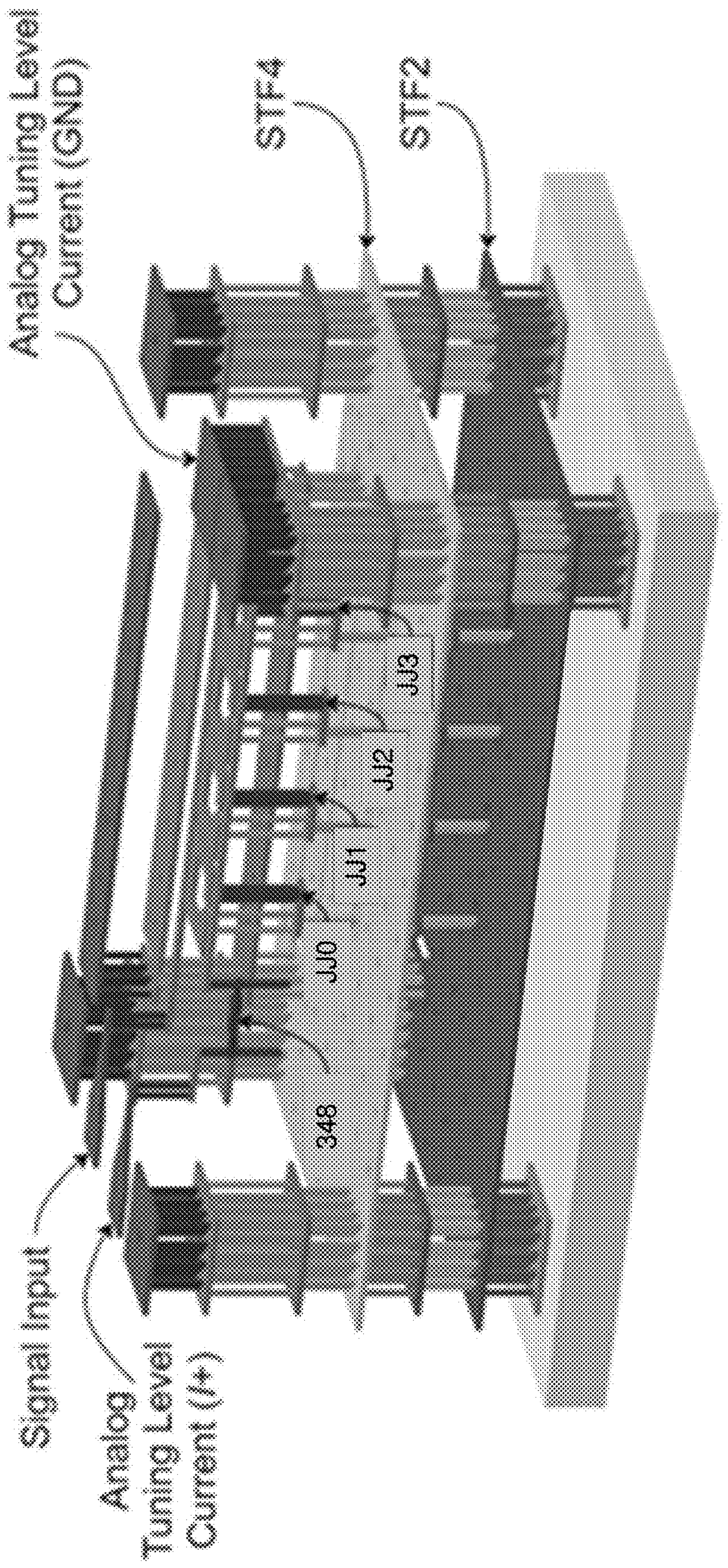
FIG. 6 is a three-dimensional (3D) top perspective view (with intentionally scaled Z-direction for better visibility of the multiple layers) of the example tunable resonator of FIG. 1, in accordance with various example embodiments and implementations of the subject disclosure.
Figure 7:
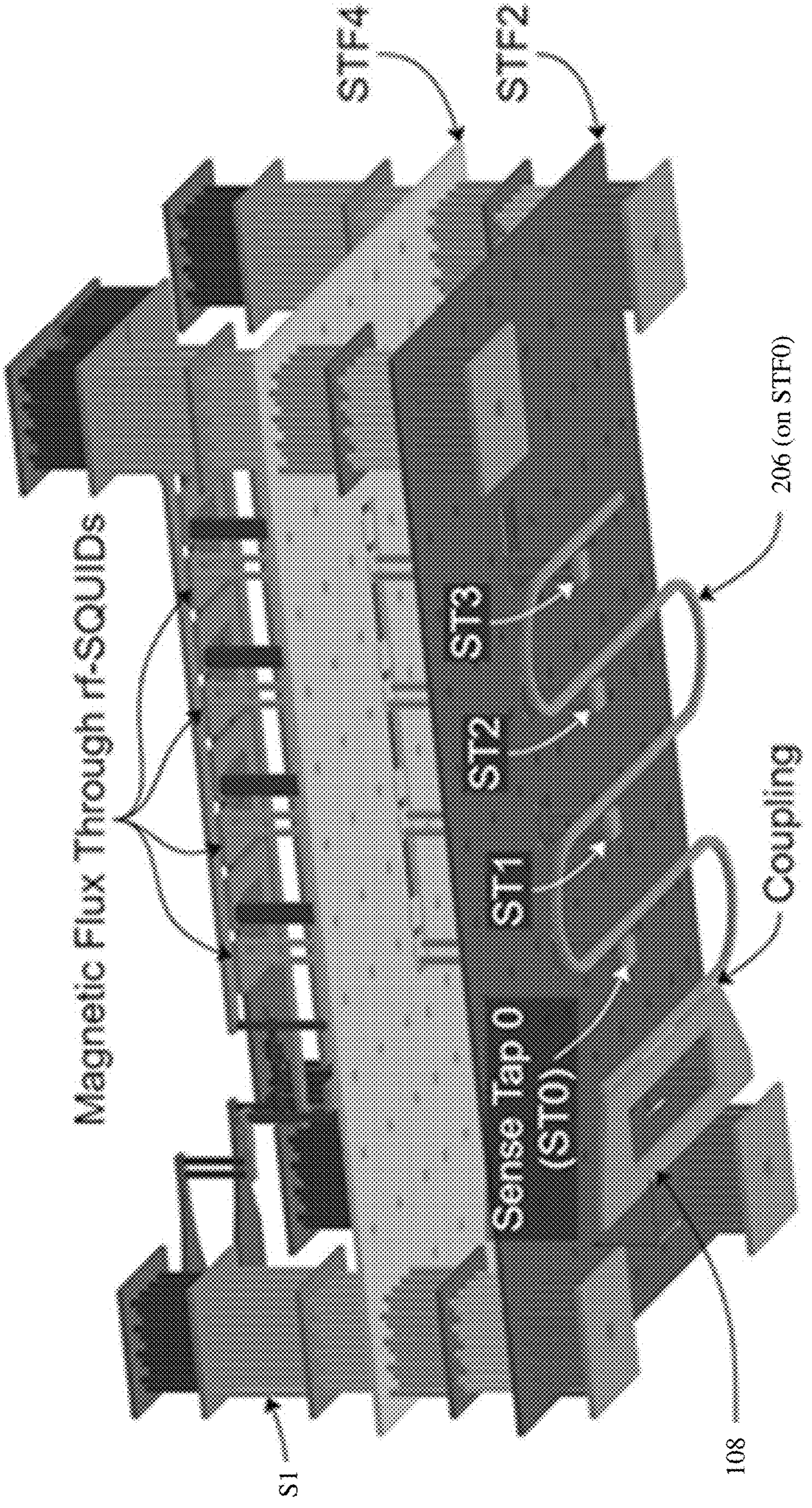
FIG. 7 is a three-dimensional (3D) bottom perspective view (with intentionally scaled Z-direction for better visibility of the multiple layers) of the example tunable resonator of FIG. 1, including a sense tap device, in accordance with various example embodiments and implementations of the subject disclosure.

As shown in the 3D expanded views of the layout of FIGS. 6 and 7, (with intentionally scaled Z-direction for better visibility of the multiple layers), the superconducting thin film layers (STF0-STF6) are shown along with the interconnects between them. The layers STF0 and STF1 are the superconducting thin film layers in the multilayer fabrication stack, and the four corners of the design show the multilayer shielding poles from the electric and magnetic field interference. In FIG. 6, the current controlled resistor 348 is indicated, as are the Josephson junctions JJ0-JJ3 of the rf-SQUIDS designed on the various layers in the fabrication process; (the layer for the Josephson junctions has a sandwich stack of two superconducting metals separated by a dielectric; the current controlled resistor 348 is designed on a specific kiloohm (kΩ) resistance layer). In FIG. 7, the sense taps are labeled ST0-ST3 distributed at periodic locations on the fixed resonator 206.

FIG. 8 shows a fabrication stack cross-section, which includes multiple superconducting thin films (STF0-STF6) above a substrate (SUB) connected using superconducting interconnects (SI0-SI5). Also shown in FIG. 5 is a short SI (SSI0), current controlling resistor layer (CCR) and Josephson Junctions (JJ0-JJ3).

In one implementation, the capacitor 332 of the tunable resonator 102 (FIG. 1) is a MIM capacitor, which offers higher capacitance density and higher self-resonance compared to an interdigitated capacitor design, for example. The capacitor can be a MIM multi-stack capacitor with multiple STF layers and dielectric layers between the STF layers, effectively realizing capacitors connected in parallel. A higher capacitance using a smaller area is achieved using this design technique. More particularly, one implementation of the design uses a stack of five STF 10 μm×80 μm rectangular sections separated by four ~100 nm dielectric layers. The capacitance value offered by the stack can be closely estimated by means of electromagnetic EM simulations. The overall capacitor area can be further reduced and the value of achieved capacitance can be increased by increasing the number of stacked metal layers as per the process stack.

Figure 9:
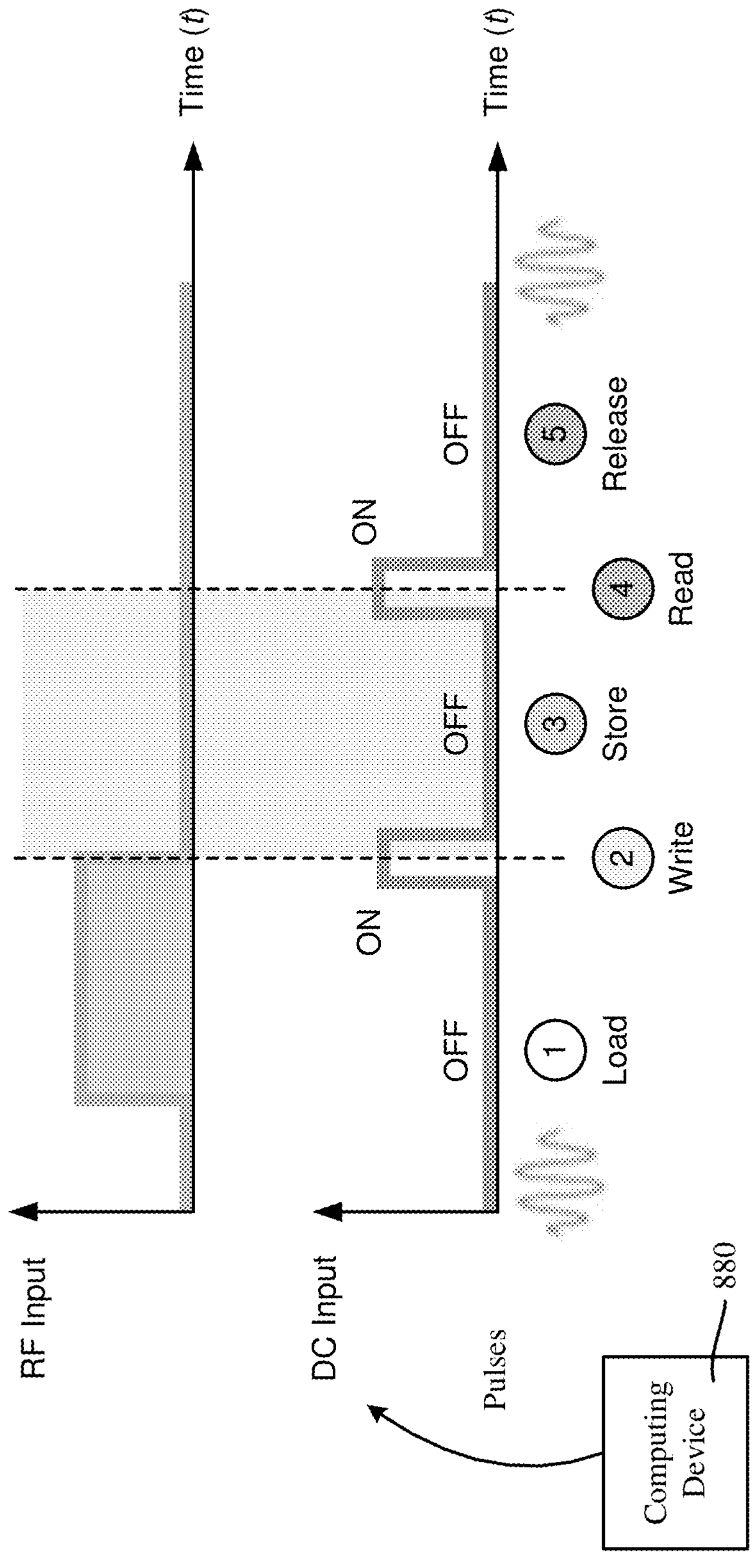
FIG. 9 is a representation of an example pulse sequence for writing to and reading from the quantum memory cell, in accordance with various example embodiments and implementations of the subject disclosure.

Turning to usage of the quantum memory cell, FIG. 9 shows a pulse sequence for writing quantum information to and reading the quantum information from the quantum memory cell. In this setup, quantum information is delivered via an RF input pulse traveling through the transmission feed-line. For most of the RF pulse duration (1), the tunable interface resonator and quantum storage cavity are detuned and isolated. At the end of the RF pulse, a current signal applied (e.g., via a classical computing device 880, which can also monitor the sense tap device) to the control line as a read pulse (2) alters the flux of the rf-SQUIDs, enabling strong coupling between the tunable interface resonator and quantum storage cavity for information exchange via a SWAP operation.

Once the SWAP operation is complete and the control current is removed, the resonators detune again, securely storing (3) the exchanged information in the quantum storage cavity, as determined by its internal Q-factor. To read the quantum information, the tunable interface resonator and quantum storage cavity are brought back into strong coupling with a brief DC pulse, that is, a read pulse (4). This SWAP operation, which is significantly faster than the decay rate of the tunable interface resonator, ensures efficient transfer of the EM field between the two resonators with minimal energy loss. After the read, the tunable resonator is detuned (release (5).

As described herein, the SWAP operation is accomplished by aligning the resonant frequencies of the two resonators, allowing for periodic energy exchange. The reading and writing operations in a quantum memory cell are executed using this SWAP operation, which defines the read/write process of a quantum memory cell. The read and write processes occur in the strong coupling regime. The SWAP function for RW operation:

$$f_{QSC}(|\psi\rangle^{(b)}, |\phi\rangle^{(QSC)}) = SWAP_{b,QSC}(|\psi\rangle^{(b)} \otimes |\phi\rangle^{(QSC)}) = |\phi\rangle^{(b)} \otimes |\psi\rangle^{(QSC)}$$

where 'b' stands for bus qubit and 'QSC' stands for quantum memory cell. The quantum memory cell read process is the photon emission from the microwave resonator, while the write process is the microwave photon absorption.

To optimize the planar microwave circuit for this application, electromagnetic modeling using a full-field 3D commercial electromagnetic solver was conducted. The variation in inductance at the tunable interface resonator as a function of the current applied to the rf-SQUIDs is significant.

Figure 10:
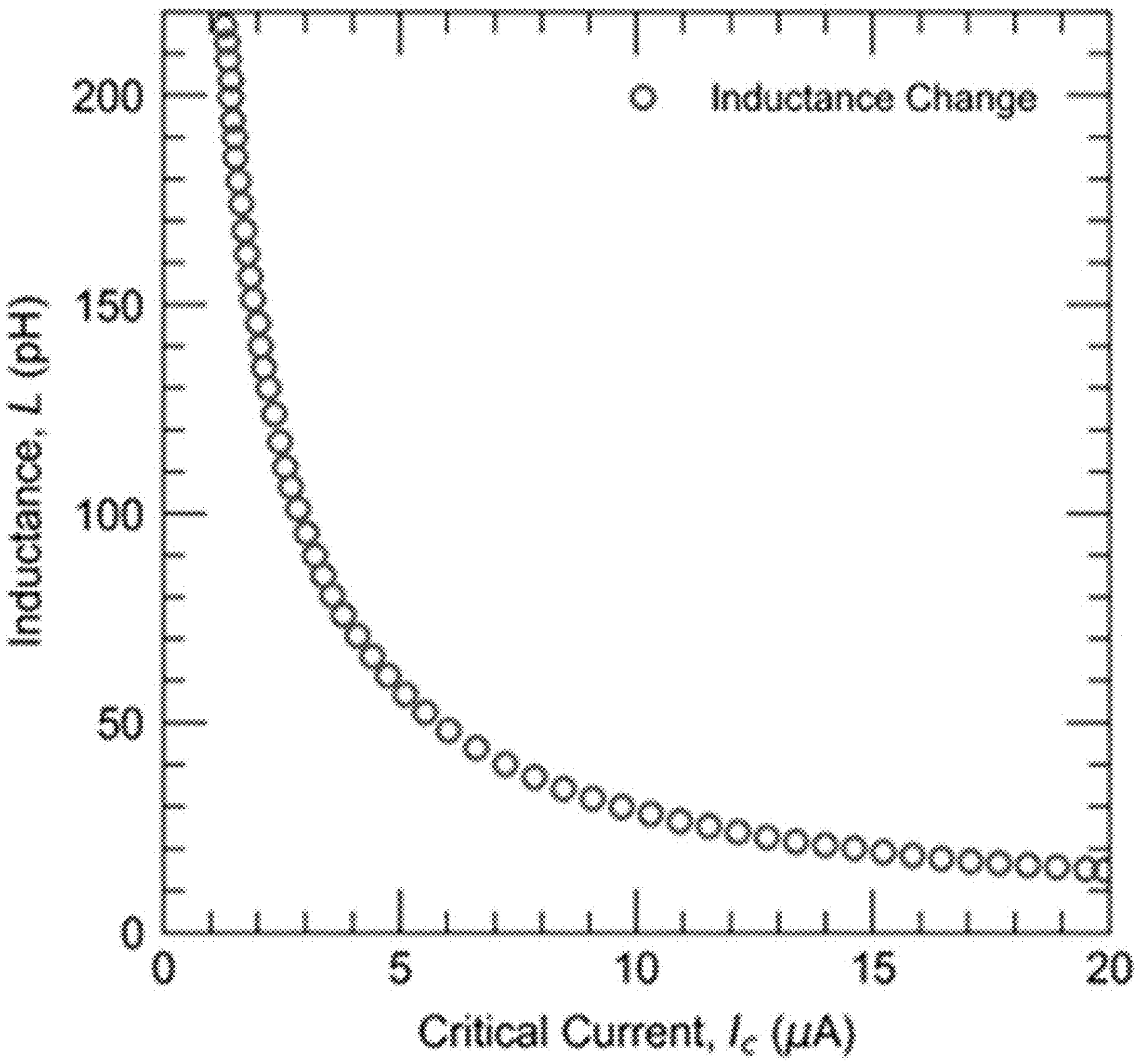
FIG. 10 is a graphical representation showing example tunable interface resonator inductance as a function of a critical current applied to rf-SQUIDs, in accordance with various example embodiments and implementations of the subject disclosure.
Figure 11:
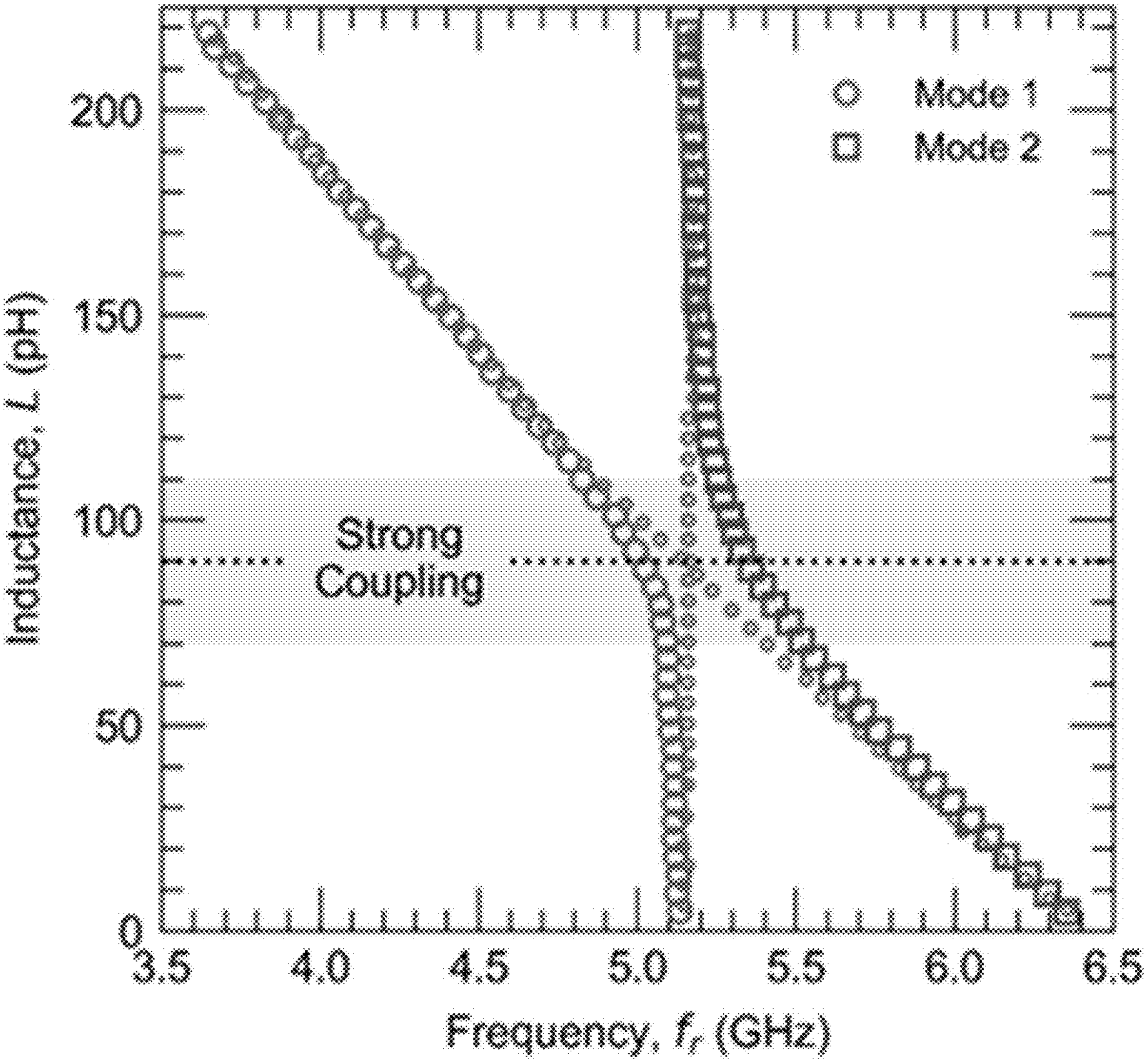
FIG. 11 is a graphical representation showing example resonance frequencies of a tunable interface resonator and quantum storage cavity as functions of the rf-SQUID inductance, showing a strong coupling region, in accordance with various example embodiments and implementations of the subject disclosure.

The simulated response of this relationship is shown in FIG. 10. Additionally, FIG. 11 shows the resonant frequencies of the tunable interface resonator and quantum storage cavity as a function of inductance change in tunable interface resonator. This graph highlights the frequency crossover between the two resonators, indicating strong coupling between the two superconducting resonant cavities, (as highlighted by the grey region, strong coupling between the two resonators occurs between 70 and 110 picohenries), the significant factor in enabling photon swaps between the tunable interface resonator and quantum storage cavity. The coupling strength (g) between the two resonators can be estimated using an analytical harmonic oscillators model, described by:

$$f_{\pm} = \frac{1}{2}(f_1 + f_2) \pm \sqrt{g^2 + \left(\frac{\Delta f}{2}\right)^2}$$

where $f_+$ and $f_-$ are the resonance frequencies of the combined system, $f_1$ is the resonance frequency of the QSC, $f_2$ is the resonance frequency of the tunable interface resonator, and $\Delta f = f_2 - f_1$ is the detuning between the two modes. By fitting the intercrossing region in the graph, it can be determined that the coupling strength g is approximately 96 MHz. This substantial interaction between the tunable interface resonator and quantum storage cavity facilitates an efficient read/write process for the memory cell described herein. The strong coupling allows for rapid and precise transfer of electromagnetic fields between the cavities, making it very suitable for quantum information storage and retrieval. The lifetime of the stored photon, and thus the coherence time, is largely determined by the quality factor of the quantum storage cavity.

One or more implementations and embodiments can be embodied in system, such as described and represented in the example herein. The system can include a sense tap device, and a quantum memory cell. The quantum memory cell can include a quantum storage cavity including a fixed resonator having a first resonance frequency, and a superconducting tunable resonator device configured to resonate at the first resonance frequency to couple with the fixed resonator, to transfer quantum information from the superconducting tunable resonator device to the quantum storage cavity as stored quantum information, and configured to resonate at a second resonance frequency, that is different from the first resonance frequency, to decouple from the fixed resonator to prevent transfer of the quantum information back from the quantum storage cavity to the superconducting tunable resonator device, to maintain the stored quantum information in the quantum storage cavity. The sense tap device can be coupled to the quantum storage cavity to monitor a quantum state of the stored quantum information.

The sense tap device can include a group of sense taps positioned at different locations along the fixed resonator of the quantum storage cavity.

The fixed resonator can include a meandered microstrip fixed resonator, and wherein the sense tap device can include a group of sense taps equally or substantially equally spaced at different locations along the fixed resonator of the quantum storage cavity.

The sense tap device can be coupled to a computing device configured for real-time monitoring of sense tap data representative of the quantum state.

The computing device can control whether the superconducting tunable resonator device can be resonating at the first resonance frequency or the second resonance frequency.

The superconducting tunable resonator device can include a superconducting transmission line coupled to a superconducting inductor, a capacitor, and a resonator, one or more radio frequency-superconducting quantum interference devices (rf-SQUIDs) inductively coupled to the superconducting transmission line, and a tuning circuit including a control wire inductively coupled to the one or more rf-SQUIDs; a first amount of controlled direct current carried by the control wire can determine a first inductance of the one or more rf-SQUIDs to tune the superconducting tunable resonator device to the first resonance frequency, and a second amount of controlled direct current carried by the control wire can determine a second inductance of the one or more rf-SQUIDs to tune the superconducting tunable resonator device to the second resonance frequency.

The one or more rf-SQUIDs can include an array of rf-SQUIDs aligned between the superconducting transmission line and the control wire.

The one or more rf-SQUIDs can include a group of respective rf-SQUIDs, and wherein the sense tap device can include respective sense taps coupled to the respective rf-SQUIDs.

The respective sense taps can be coupled to the respective rf-SQUIDs via respective interconnects.

The quantum storage cavity can include a quarter-wavelength resonator, and wherein the superconducting tunable resonator device can include a half-wavelength resonator.

The stored quantum information can include a quantum bit, and wherein the sense tap device can be usable to monitor coherence of the stored quantum bit.

Figure 12:
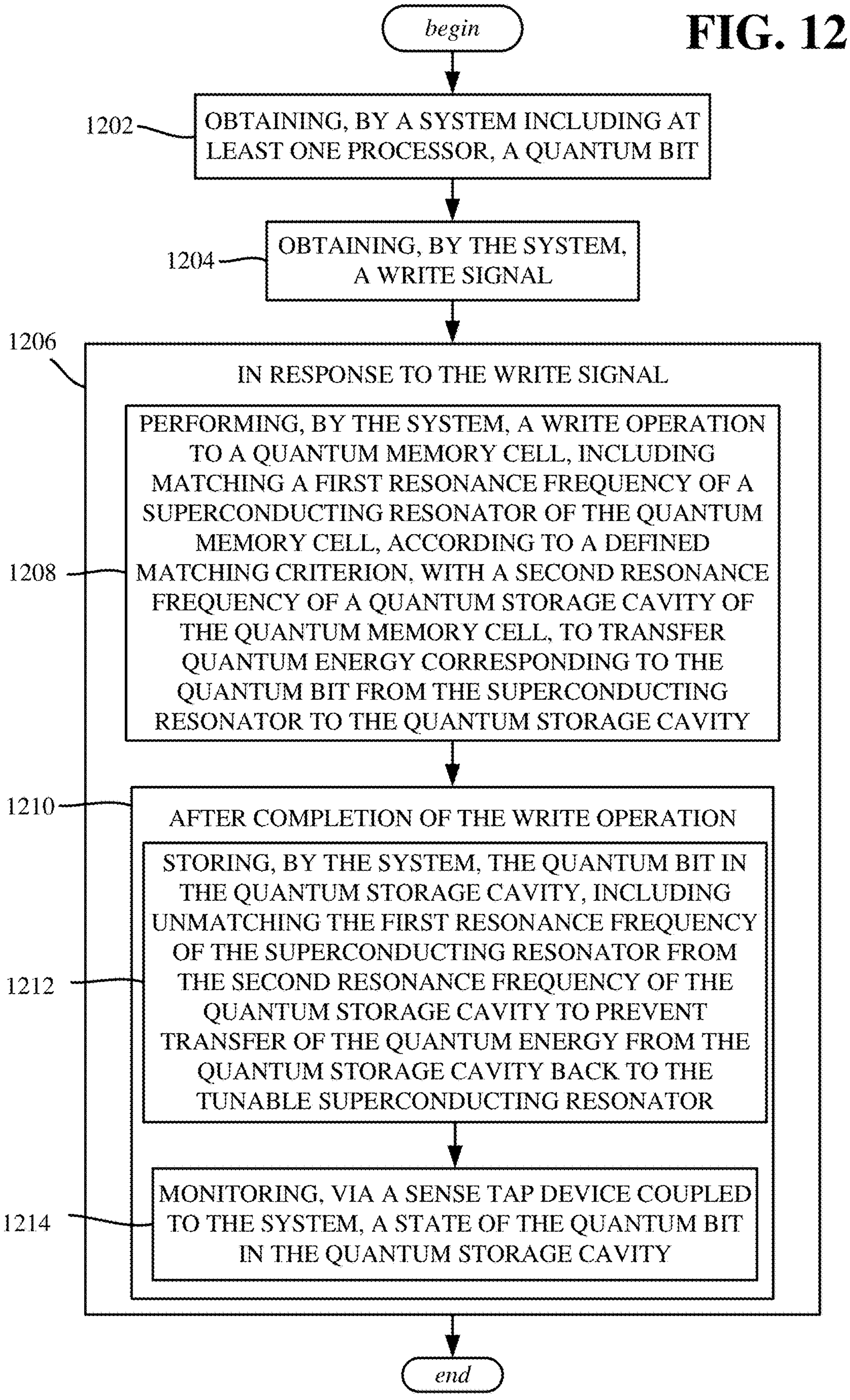
FIG. 12 is a flow diagram showing example operations related to monitoring a state of a quantum bit written to a quantum storage cavity, using a sense tap device coupled to the quantum storage cavity, in accordance with various example embodiments and implementations of the subject disclosure.

One or more example implementations and embodiments, such as corresponding to example operations of a method, can be represented in FIG. 12. Example operation 1202 represents obtaining, by a system including at least one processor, a quantum bit. Example operation 1204 represents obtaining, by the system, a write signal. Example operation 1206 represents, in response to the write signal, performing example operations 1208, 1210, 1212 and 1214. Example operation 1208 represents performing, by the system, a write operation to a quantum memory cell, including matching a first resonance frequency of a superconducting resonator of the quantum memory cell, according to a defined matching criterion, with a second resonance frequency of a quantum storage cavity of the quantum memory cell, to transfer quantum energy corresponding to the quantum bit from the superconducting resonator to the quantum storage cavity. Example operation 1210 represents, after completion of the write operation, storing, by the system, the quantum bit in the quantum storage cavity, including unmatching the first resonance frequency of the superconducting resonator from the second resonance frequency of the quantum storage cavity to prevent transfer of the quantum energy from the quantum storage cavity back to the tunable superconducting resonator (example operation 1212), and monitoring, via a sense tap device coupled to the system, a state of the quantum bit in the quantum storage cavity (example operation 1214).

Monitoring the state of the quantum bit in the quantum storage cavity can include at least one of: performing error detection, monitoring for deviations in an expected quantum state of the quantum bit, or monitoring coherence of the quantum bit.

Further operations can include obtaining, by the system, a read signal, and in response to the read signal, performing, by the system, a read operation from the quantum memory cell, which can include matching, according to the defined matching criterion, the first resonance frequency of the superconducting resonator of the quantum memory cell with the second resonance frequency of the quantum storage cavity of the quantum memory cell, to transfer the quantum energy corresponding to the quantum information back from the quantum storage cavity to the superconducting resonator for output by the system.

The superconducting resonator can be tunable, the second resonance frequency of the quantum storage cavity can be fixed, and matching the first resonance frequency with the second resonance frequency can include tuning the first resonance frequency based on the second resonance frequency.

One or more implementations and embodiments can be embodied in a system, such as described and represented in the examples herein. The system can include a quantum memory cell, and the quantum memory cell can include a quantum storage cavity including a first resonator having a first resonance frequency, and a second resonator including a superconducting tunable resonator device. The superconducting tunable resonator device can include a superconducting transmission line coupled to a signal input port, a superconducting inductor, a capacitor, and a tuning device that tunes a second, variable resonant frequency of the superconducting tunable resonator device. The tuning device can include one or more radio frequency-superconducting quantum interference devices (rf-SQUIDs) inductively coupled to the superconducting transmission line, and a control wire inductively coupled to the one or more rf-SQUIDS, wherein a direct current applied to the control wire flows through the control wire as a control current that determines an inductance of the one or more rf-SQUIDs to tune the second, variable resonant frequency of the superconducting tunable resonator device. A quantum bit on the superconducting transmission line can be written to the quantum storage cavity in response to the second, variable resonant frequency of the superconducting tunable resonator device being tuned to the first resonance frequency, and the quantum bit can be stored in the quantum storage cavity in response to the second, variable resonant frequency of the superconducting tunable resonator device being detuned from the first resonance frequency. The system can include a sense tap device proximate to the first resonator and coupled to the quantum memory cell via the one or more rf-SQUIDS; the sense tap device can be configured to monitor a quantum state of the quantum bit when stored in the quantum storage cavity.

The sense tap device can output data representative of the quantum state to a non-quantum computing device.

The one or more rf-SQUIDs can include a group of respective rf-SQUIDs, the sense tap device can include respective sense taps proximate to the first resonator at different respective locations, and wherein the sense tap device can monitor respective quantum state values of the quantum bit at the different respective locations.

The group of respective rf-SQUIDs can include an array of rf-SQUIDs aligned between the superconducting transmission line and the control wire, and the respective sense taps can be coupled to the quantum memory cell via the respective rf-SQUIDS of the group via respective interconnects.

The system further can include shielding poles configured to magnetically shield the quantum memory cell from one or more superconducting devices proximate to the quantum memory cell.

As can be seen, the technology described herein facilitates a quantum memory cell based on variable coupling between a tunable interface resonator and a quantum storage cavity, in which the state of a stored qubit can be monitored via sense taps. Unlike current memory applications that achieve long coherence times using weakly coupled resonator-qubit networks with a fixed frequency and a high-quality factor, the technology described herein does not significantly slow down quantum operations, increasing the length of quantum gates. Instead, the slow operational limitation is overcome by incorporating tunable inductive elements into the resonators, allowing rapid and dynamic adjustment of the resonator's tuning, enabling them to interact selectively with different components within the circuit.

The technology described herein facilitates a scalable, current-tunable quantum memory design and concept that is compatible with superconducting qubit platforms; indeed, as large-scale quantum memory systems need integration of numerous quantum memory cells high levels of integration are supported, which ensures the scalability needed for constructing extensive quantum memory arrays.

Indeed, the technology described herein is capable of storing quantum information for extended (e.g. millisecond) durations, providing long coherence times that preserve the integrity of the quantum state. Ensuring a prolonged storage time is a significant requirement for an effective quantum memory cell. At the same time, the technology supports rapid and precise read and write operations, allowing for the accurate manipulation of quantum information. The current-controlled resonator as described herein controllably modulates the coupling between a transmission feed-line and a superconducting storage cavity, which enables precise control over the quantum state stored in the cavity. The feasibility and effectiveness of this design have been validated through simulations, showing its potential for practical implementation.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As used in this application, the terms "component," "system," "platform," "layer," "selector," "interface," and the like are intended to refer to a computer-related resource or an entity related to an operational apparatus with one or more specific functionalities, wherein the entity can be either hardware, a combination of hardware and software, software, or software in execution. As an example, a component can be an apparatus with specific functionality provided by mechanical parts operated by electric or electronic circuitry. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances.

While the embodiments are susceptible to various modifications and alternative constructions, certain illustrated implementations thereof are shown in the drawings and have been described above in detail. It should be understood, however, that there is no intention to limit the various embodiments to the specific forms disclosed, but on the contrary, the intention is to cover all modifications, alternative constructions, and equivalents falling within the spirit and scope.

In addition to the various implementations described herein, it is to be understood that other similar implementations can be used or modifications and additions can be made to the described implementation(s) for performing the same or equivalent function of the corresponding implementation(s) without deviating therefrom. Still further, multiple processing chips or multiple devices can share the performance of one or more functions described herein, and similarly, storage can be effected across a plurality of devices. Accordingly, the various embodiments are not to be limited to any single implementation, but rather are to be construed in breadth, spirit and scope in accordance with the appended claims.

What is claimed is:

1. A system, comprising:

a sense tap device; and a quantum memory cell, comprising:

a quantum storage cavity comprising a fixed resonator having a first resonance frequency, and a superconducting tunable resonator device configured to resonate at the first resonance frequency to couple with the fixed resonator, to transfer quantum information from the superconducting tunable resonator device to the quantum storage cavity as stored quantum information, and configured to resonate at a second resonance frequency, that is different from the first resonance frequency, to decouple from the fixed resonator to prevent transfer of the quantum information back from the quantum storage cavity to the superconducting tunable resonator device, to maintain the stored quantum information in the quantum storage cavity, wherein the sense tap device is coupled to the quantum storage cavity to monitor a quantum state of the stored quantum information, and wherein the sense tap device comprises a group of sense taps equally or substantially equally spaced at different locations along the fixed resonator of the quantum storage cavity.

2. The system of claim 1, wherein the fixed resonator comprises a meandered microstrip fixed resonator.

3. The system of claim 1, wherein the sense tap device is coupled to a computing device configured for real-time monitoring of sense tap data representative of the quantum state.

4. The system of claim 3, wherein the computing device controls whether the superconducting tunable resonator device is resonating at the first resonance frequency or the second resonance frequency.

5. The quantum memory cell of claim 1, wherein the superconducting tunable resonator device comprises a superconducting transmission line coupled to a superconducting inductor, a capacitor, and a resonator, one or more radio frequency-superconducting quantum interference devices (rf-SQUIDs) inductively coupled to the superconducting transmission line, and a tuning circuit comprising a control wire inductively coupled to the one or more rf-SQUIDs, wherein a first amount of controlled direct current carried by the control wire determines a first inductance of the one or more rf-SQUIDs to tune the superconducting tunable resonator device to the first resonance frequency, and wherein a second amount of controlled direct current carried by the control wire determines a second inductance of the one or more rf-SQUIDs to tune the superconducting tunable resonator device to the second resonance frequency.

6. The quantum memory cell of claim 5, wherein the one or more rf-SQUIDs comprise an array of rf-SQUIDs aligned between the superconducting transmission line and the control wire.

7. The system of claim 5, wherein the one or more rf-SQUIDs comprise a group of respective rf-SQUIDs, and wherein the sense tap device comprises respective sense taps coupled to the respective rf-SQUIDs.

8. The system of claim 7, wherein the respective sense taps are coupled to the respective rf-SQUIDs via respective interconnects.

9. The quantum memory cell of claim 1, wherein the quantum storage cavity comprises a quarter-wavelength resonator, and wherein the superconducting tunable resonator device comprises a half-wavelength resonator.

10. The quantum memory cell of claim 1, wherein the stored quantum information comprises a quantum bit, and wherein the sense tap device is usable to monitor coherence of the quantum bit.

11. A method, comprising:

obtaining, by a system comprising at least one processor, a quantum bit;

obtaining, by the system, a write signal; and in response to the write signal, performing, by the system, a write operation to a quantum memory cell, comprising matching a first resonance frequency of a superconducting resonator of the quantum memory cell, according to a defined matching criterion, with a second resonance frequency of a quantum storage cavity of the quantum memory cell, to transfer quantum energy corresponding to the quantum bit from the superconducting resonator to the quantum storage cavity, and after completion of the write operation, storing, by the system, the quantum bit in the quantum storage cavity, comprising unmatching the first resonance frequency of the superconducting resonator from the second resonance frequency of the quantum storage cavity to prevent transfer of the quantum energy from the quantum storage cavity back to the superconducting resonator, and monitoring, via a sense tap device coupled to the system, a state of the quantum bit in the quantum storage cavity, wherein the sense tap device comprises a group of sense taps equally or substantially equally spaced at different locations along the superconducting resonator of the quantum storage cavity.

12. The method of claim 11, wherein the monitoring of the state of the quantum bit in the quantum storage cavity comprises at least one of: performing error detection, monitoring for deviations in an expected quantum state of the quantum bit, or monitoring coherence of the quantum bit.

13. The method of claim 11, further comprising:

obtaining, by the system, a read signal; and in response to the read signal, performing, by the system, a read operation from the quantum memory cell, comprising matching, according to the defined matching criterion, the first resonance frequency of the superconducting resonator of the quantum memory cell with the second resonance frequency of the quantum storage cavity of the quantum memory cell, to transfer the quantum energy corresponding to the quantum energy back from the quantum storage cavity to the superconducting resonator for output by the system.

14. The method of claim 11, wherein the superconducting resonator is tunable, wherein the second resonance frequency of the quantum storage cavity is fixed, and wherein the matching of the first resonance frequency with the second resonance frequency comprises tuning the first resonance frequency based on the second resonance frequency.

15. A system, comprising:

a quantum memory cell, the quantum memory cell comprising:

a quantum storage cavity comprising a first resonator having a first resonance frequency;

a second resonator comprising a superconducting tunable resonator device, the superconducting tunable resonator device comprising:

a superconducting transmission line coupled to a signal input port, a superconducting inductor, and a capacitor, and a tuning device that tunes a second, variable resonant frequency of the superconducting tunable resonator device, the tuning device comprising:

one or more radio frequency-superconducting quantum interference devices (rf-SQUIDs) inductively coupled to the superconducting transmission line, and a control wire inductively coupled to the one or more rf-SQUIDS, wherein a direct current applied to the control wire flows through the control wire as a control current that determines an inductance of the one or more rf-SQUIDs to tune the second, variable resonant frequency of the superconducting tunable resonator device, wherein a quantum bit on the superconducting transmission line is written to the quantum storage cavity in response to the second, variable resonant frequency of the superconducting tunable resonator device being tuned to the first resonance frequency, and wherein the quantum bit is stored in the quantum storage cavity in response to the second, variable resonant frequency of the superconducting tunable resonator device being detuned from the first resonance frequency; and a sense tap device proximate to the first resonator and coupled to the quantum memory cell via the one or more rf-SQUIDS, the sense tap device configured to monitor a quantum state of the quantum bit when stored in the quantum storage cavity, wherein the sense tap device comprises a group of sense taps equally or substantially equally spaced at different locations along the first resonator of the quantum storage cavity.

16. The system of claim 15, wherein the sense tap device outputs data representative of the quantum state to a non-quantum computing device.

17. The system of claim 15, wherein the one or more rf-SQUIDs comprise a group of respective rf-SQUIDs, wherein the sense tap device comprises respective sense taps proximate to the first resonator at different respective locations, and wherein the sense tap device monitors respective quantum state values of the quantum bit at the different respective locations.

18. The system of claim 17, wherein the group of respective rf-SQUIDs comprises an array of rf-SQUIDs aligned between the superconducting transmission line and the control wire, and wherein the respective sense taps are coupled to the quantum memory cell via the respective rf-SQUIDS of the group via respective interconnects.

19. The system of claim 15, further comprising shielding poles configured to magnetically shield the quantum memory cell from one or more superconducting devices proximate to the quantum memory cell.

20. The system of claim 15, wherein the sense tap device is coupled to a computing device configured for real-time monitoring of sense tap data representative of the quantum state.

* * * * *